(12) United States Patent
Deguchi

(10) Patent No.: US 6,466,300 B1
(45) Date of Patent: Oct. 15, 2002

(54) SUBSTRATE PROCESSING APPARATUS

(75) Inventor: Masatoshi Deguchi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/525,925

(22) Filed: Mar. 15, 2000

(30) Foreign Application Priority Data

Mar. 18, 1999 (JP) .......................................... 11-074124

(51) Int. Cl.⁷ .......................... G03B 27/32; G03D 5/00; C23C 16/00; B65G 25/00
(52) U.S. Cl. ........................ 355/27; 396/611; 118/715; 414/152
(58) Field of Search .......................... 355/27; 396/604, 396/611; 118/719, 715, 720; 414/225.01, 152

(56) References Cited

U.S. PATENT DOCUMENTS 5,844,662 A * 12/1998 Akimoto et al. ............... 355/27
5,937,223 A * 8/1999 Akimoto et al. ............ 396/604
5,963,753 A * 10/1999 Ohtani et al. ................ 396/611
6,008,978 A * 12/1999 Tateyama .................... 361/212

FOREIGN PATENT DOCUMENTS

JP  11-233421  *  8/1999  ......... H01L/21/027

* cited by examiner

Primary Examiner—Alan A. Mathews
Assistant Examiner—Peter B. Kim
(74) Attorney, Agent, or Firm—Rader, Fishman & Grauer PLLC

(57) ABSTRACT

A substrate processing apparatus for performing processing having a plurality of processes, for example, resist coating and developing processing for a substrate, comprises a plurality of processing mechanisms each for performing predetermined processing for the substrate in correspondence with the plurality of processes and a transfer section for transferring the substrate. The transfer section includes a plurality of transfer mechanisms for carrying the substrate into or out of the plurality of processing mechanisms and a buffer mechanism provided at a position to which each of the plurality of transfer mechanisms is accessible and having a standby section for allowing the substrate to stand by thereon temporarily, and the plurality of processing mechanisms are provided around the transfer section.

19 Claims, 6 Drawing Sheets

SUBSTRATE PROCESSING APPARATUS

BACKGROUND OF THE INVENTION

1. Field of the Invention

The present invention relates to a substrate processing apparatus for performing processing such as resist coating and developing processing on a substrate.

2. Description of the Related Art

In processes of semiconductor device fabrication, for instance, there is a series of processes in which a substrate to be processed, for example, a semiconductor wafer, is coated with a processing solution, for example, a photoresist solution, and a circuit pattern and the like are reduced in size and a photoresist film is exposed and developed using photolithography technology. These processes are quite important for integrating semiconductor devices to a high degree.

In such processes, a semiconductor wafer which has been subjected to cleaning processing is given hydrophobic processing in an adhesion processing unit and then cooled in a cooling processing unit, and thereafter coated with a photoresist film in a resist coating unit. The semiconductor wafer on which the photoresist film is formed is subjected to pre-bake processing in a hot plate unit, and thereafter cooled in a cooling processing unit and then exposed in a predetermined pattern in an exposure apparatus. Subsequently, the semiconductor wafer after exposure is subjected to postexposure bake processing and thereafter cooled in a cooling processing unit, and the exposed pattern is developed by applying a developing solution in a developing unit. Finally, post-bake processing is performed in a hot plate unit to enhance thermal reforming for polymerization and the fixedness between the semiconductor wafer and its pattern.

Such a series of processes except for exposure processing is performed by means of a resist coating and developing system in which the aforesaid processing units are integrally combined. As one type of such resist coating and developing systems, proposed (Japan Patent Laid-open No. Hei 4-85812) is one system in which the aforesaid plurality of processing units are disposed to be tiered in the vertical direction around a transfer path extended in the vertical direction so that a semiconductor wafer is carried into and out of each processing unit by means of a carrying mechanism which vertically moves in the transfer path. In such a processing system, it is possible to reduce a transfer path of a substrate in length when the substrate is carried between a plurality of processing mechanisms and to miniaturize apparatus, so that the substrate can be carried in a short period of time and apparatus efficiency can be enhanced.

SUMMARY OF THE INVENTION

An object of the present invention is to provide a substrate processing apparatus suitable for processing of a large-sized substrate with a small apparatus footprint and high throughput.

However, in recent years, upsizing of semiconductor wafers has progressed into an era of 300 mm-wafers. When the above system is used to cope with such large-sized semiconductor wafers, the footprint of apparatus thereof necessarily becomes large. Moreover, the throughput is required to be improved further.

To achieve the above object, the main aspect of the present invention is a substrate processing apparatus for performing processing having a plurality of processes for a substrate which comprises: a plurality of processing mechanisms each for performing predetermined processing for the substrate in correspondence with the plurality of processes; and a transfer section for transferring the substrate, the transfer section including a plurality of transfer mechanisms for carrying the substrate into or out of the plurality of processing mechanisms and a buffer mechanism provided at a position to which each of the plurality of transfer mechanisms is accessible and having a standby section for allowing the substrate to stand by thereon temporarily, and the plurality of processing mechanisms being provided around the transfer section.

As described above, the plurality of processing mechanisms are disposed around the transfer section including the plurality of transfer mechanisms, whereby many processing mechanisms can be arranged around the transfer section, so that the footprint-per-processing ability can be made smaller than in the case of using an apparatus in which a plurality of processing mechanisms are disposed around one transfer mechanism. Moreover, the buffer mechanism is disposed at a position to which each of the plurality of transfer mechanisms is accessible, whereby a period of time of restraint of the transfer mechanism can be reduced, thus preventing the transfer mechanism from standing by while placing the substrate thereon, resulting in high throughput. Furthermore, since it is also possible to prevent the substrate from being left standing in the processing mechanism after the expiration of a predetermined period of time, a bad influence exerted on the substrate can be avoided.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
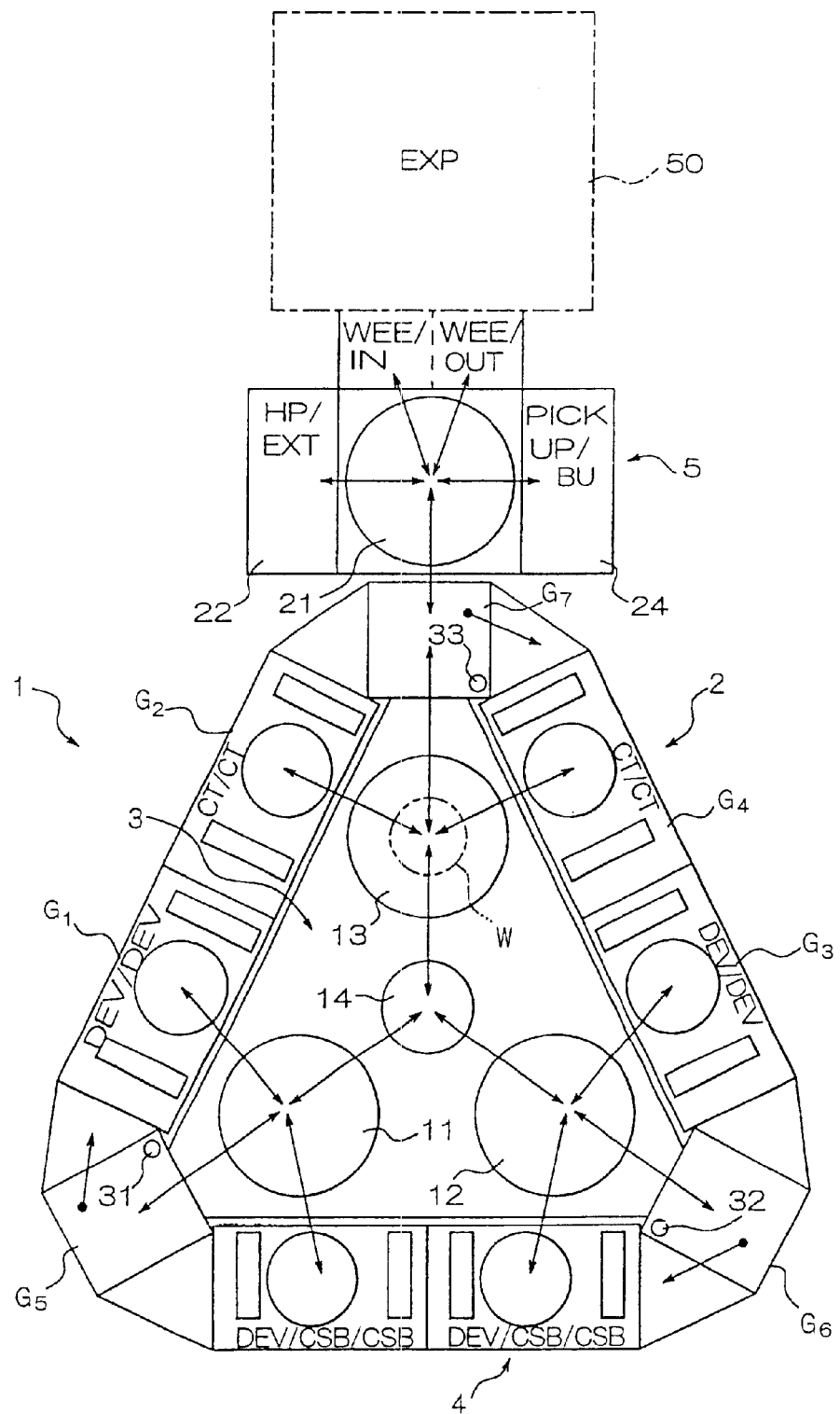
FIG. 1 is a plane view of the whole configuration of a coating and developing system for a semiconductor wafer according to an embodiment of the present invention.

FIG. 1 is a schematic plane view showing a resist coating and developing system according to an embodiment of the present invention.

A resist coating and developing system 1 comprises a processing station 2 including a plurality of processing units for performing a series of processing relating to resist coating and developing for a semiconductor wafer W, a transfer section 3, provided inside the processing station 2 in such a manner to be surrounded by the processing station 2, for transferring the semiconductor wafer W, a cassette station 4, provided at a part of the processing station 2, capable of placing a wafer cassette CR housing a plurality of semiconductor wafers W, for example, 25 wafers W per wafer cassette CR thereon, and an interface section 5 for delivering the wafer W to/from an exposure apparatus 50 provided adjacent to the processing station 2.

The above processing station 2 includes seven processing sections $G_1$, $G_2$, $G_3$, $G_4$, $G_5$, $G_6$, and $G_7$ in each of which a plurality of processing units are multi-tiered and two developing units (DEV) provided on the, cassette station 4 described later. The processing sections $G_1$, $G_2$, $G_3$, $G_4$, $G_5$, $G_6$, and $G_7$ and the two developing units (DEV) on-the cassette station 4 are arranged in such a manner to form an equilateral triangle in plane form.

Out of these, the first and second processing sections $G_1$ and $G_2$ form one side of the above equilateral triangle, the third and fourth processing sections $G_3$ and $G_4$ form another side, and the cassette station 4 and the two developing units (DEV) on the cassette station 4 form the remaining other side. At positions corresponding to three vertexes of this equilateral triangle, the fifth processing section $G_5$, the sixth processing section $G_6$, and the seventh processing section $G_7$ are disposed respectively. Moreover, the interface section 5 is disposed across the seventh processing section $G_7$ which is disposed between the second processing section $G_2$ and the fourth processing section $G_4$ from the triangle.

Figure 2A:
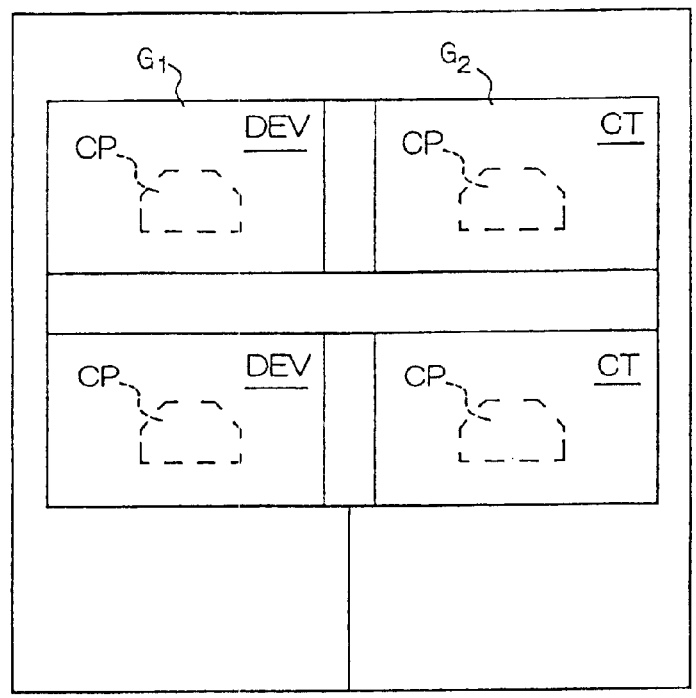
FIG. 2A and FIG. 2B are side views showing processing sections including resist coating units and developing units in FIG. 1.
Figure 2B:
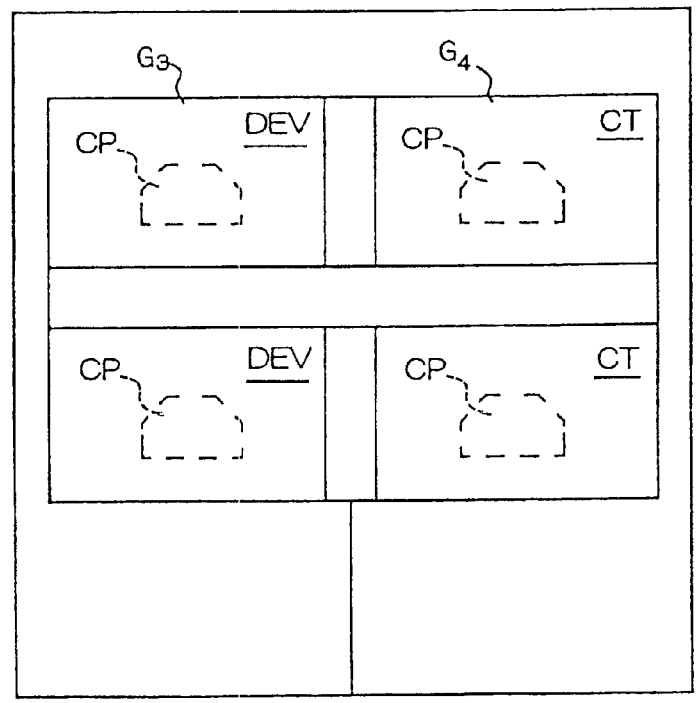

As shown in FIG. 2A and FIG. 2B, two spinner-type processing units in which the wafer W is placed on a spin chuck (not shown) to be subjected to predetermined processing in a cup CP are vertically two-tiered in each of the processing sections $G_1$, $G_2$, $G_3$, and $G_4$. Specifically, two developing units (DEV) each for developing a resist pattern are vertically two-tiered in the first processing section $G_1$ and the third processing section $G_3$, and resist coating units (CT) each for coating the wafer W with a resist are vertically two-tiered in the second processing section $G_2$ and the fourth processing section $G_4$.

Figures 3A, 3B:
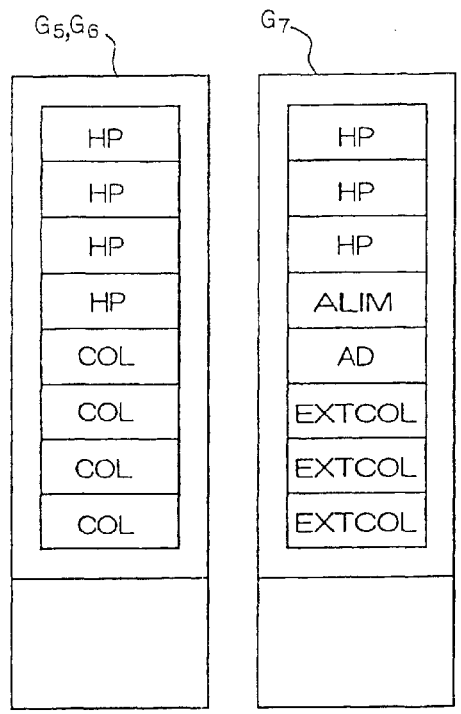
FIG. 3A and FIG. 3B are side views showing processing sections including thermal processing units in FIG. 1.

In the fifth processing section $G_5$ and the sixth processing section $G_6$, as shown in FIG. 3A, oven-type processing units in each of which the wafer W is placed on a mounting table to be subjected to predetermined processing are multi-tiered. More specifically, each of the above processing sections includes four cooling units (COL) for performing cooling processing and four hot plate units (HP) for performing heating processing for the wafer W before and after exposure processing. and additionally after developing processing, which are eight-tiered with the four hot plate units (HP) placed at the upper side thereof.

As shown in FIG. 3B, in the seventh processing unit $G_7$, three extension and cooling units (EXTCOL) each for performing cooling processing and delivering the semiconductor wafer W to/from the interface section 5, an adhesion unit (AD) for performing the so-called hydrophobic processing to improve fixedness of a resist, an alignment unit (ALIM) for performing alignment, and three-hot plate units (HP) each for performing heating processing for the wafer W before and after exposure processing and additionally after developing processing, are eight-tiered from the bottom in order.

As described above, the cooling unit (COL) and the extension and cooling unit (EXTCOL) having a low processing temperature are disposed at the lower stages and the hot plate units (HP) having a high processing temperature are disposed at the upper stages, whereby mutual thermal interference between units can be reduced. A random multistage arrangement is naturally possible. It should be noted that the processing sections $G_5$, $G_6$, and $G_7$ can be turned about hinge portions 31, 32, and 33 respectively., so that they are arranged at the illustrated positions when performing processing and entrance into the space where the transfer section 3 is placed becomes possible by turning the above processing sections in directions indicated by arrows when maintenance of the transfer section and the like are performed.

Figure 4:
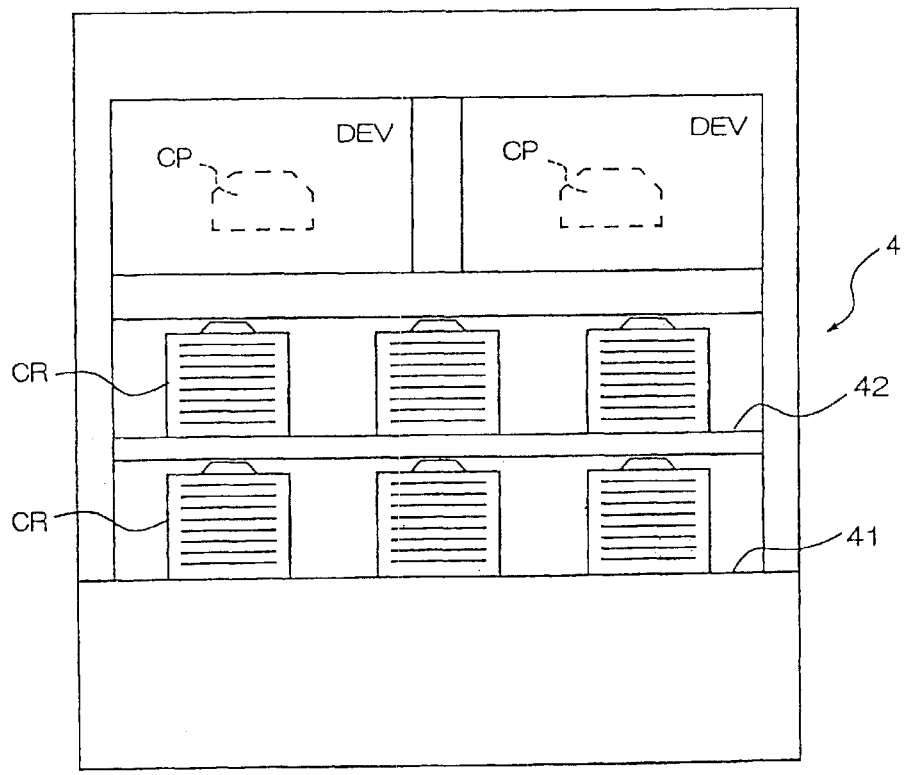
FIG. 4 is a sectional view showing a cassette station in FIG. 1.

The cassette station 4 has cassette mounting tables 41 and 42 which are vertically two-tiered, as shown in FIG. 4, on which three cassettes respectively, six cassettes in total, can be placed with the respective ports for the wafer W facing the side of the transfer section 3. The wafers W are arranged in the vertical direction (a Z-direction) in the cassette CR. As described above, the two developing units (DEV) are disposed on the cassette station 4.

As shown in FIG. 1, the transfer section 3 comprises a buffer mechanism 14 provided at the center of the inner space of the processing section 2 and three main wafer transfer mechanisms 11, 12, and 13 which are provided around the buffer mechanism 14.

Figure 5:
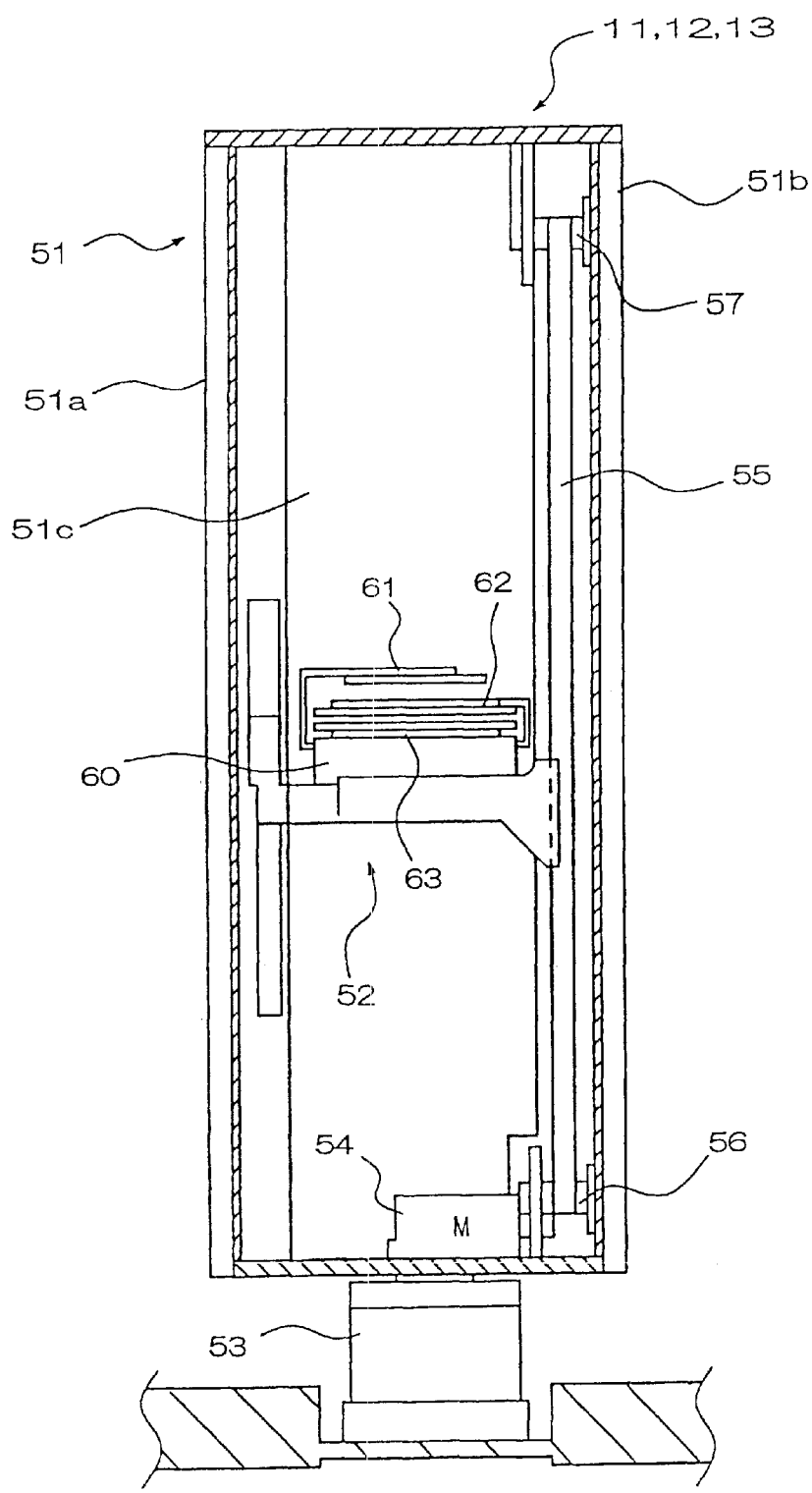
FIG. 5 is a sectional view showing a main wafer transfer mechanism in a transfer section in FIG. 1.

Each of the main wafer transfer mechanisms 11, 12, and 13 is extended in the vertical direction as shown FIG. 5 and includes a cylindrical supporter 51 having vertical walls 51a and 51b and a side opening 51c therebetween and a wafer delivery portion 52 provided within the cylindrical supporter 51 to be ascendable, and descendable along the cylindrical supporter 51 in the vertical direction (the Z-direction). The cylindrical supporter 51 can rotate by the rotational driving force of a motor 53, with which also the wafer delivery portion 52 is integrally rotated.

Figure 6:
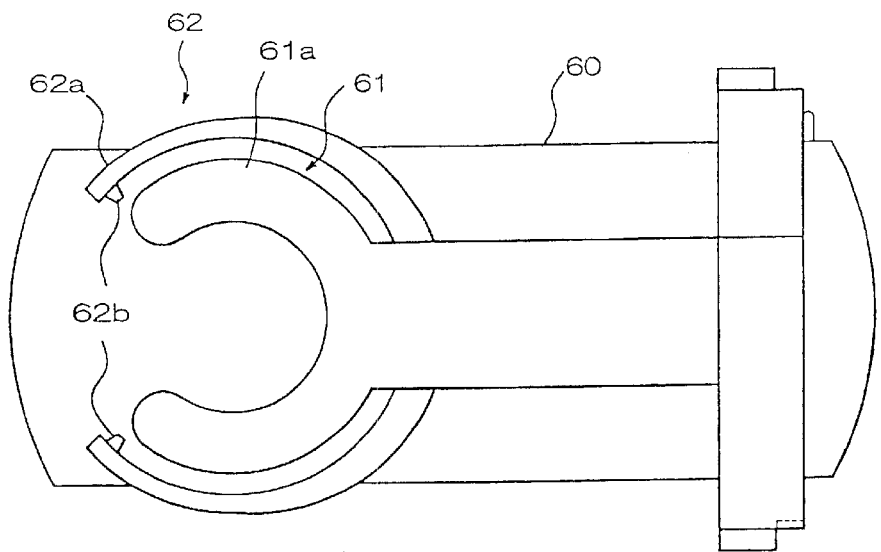
FIG. 6 is a schematic plane view showing a wafer delivery portion of the main wafer transfer mechanism in FIG. 5.

As shown in FIG. 5 and FIG. 6, the wafer delivery portion 52 includes a transfer base 60 and three wafer holding arms 61, 62, and 63 which are movable forward and rearward along the transfer base 60. Each of the arms 61, 62, and 63 has a size capable of passing through the side opening 51c of the cylindrical supporter 51. The wafer delivery portion 52 is ascended or descended by driving a belt 55 by means of a motor 54. Incidentally, a numeral 56 indicates a driving pulley and a numeral 57 indicates a slave pulley.

In the wafer delivery portion 52, the arms 61, 62, and 63 are arranged from the top in order, and the arms 61 and 62 have C-shaped wafer holding portions 61a and 62a respectively as shown in FIG. 6. Moreover, the arm 62 is provided with wafer holding pins 62b extending inward at three points (only two points are shown in the drawing) so that the wafer W is held by the holding pins 62b. Behind the arm 62 in FIG. 6, the arm 63 is structured the same as the arm 62. The arms 61, 62, and 63 can separately move in the direction indicated by the arrow in FIG. 6 by means of a motor and a belt mechanism embedded in the transfer base 60.

Each of the aforesaid three main wafer transfer mechanisms is exclusively accessible to a predetermined processing section and the like. The main wafer transfer mechanism 11 is accessible to the first processing section $G_1$, the fifth processing section $G_5$, and part of the cassette station 4 and one of the developing units (DEV) on the cassette station 4. The main wafer transfer mechanism 12 is accessible to the third-processing section $G_3$, the sixth processing section $G_6$, and part of the cassette station 4 and the other of the developing units (DEV) on the cassette station 4. The main wafer transfer mechanism 13 is accessible to the second processing section $G_2$, the seventh processing section $G_7$, and the fourth processing section $G_4$.

It should be noted that the processing units of each processing section are provided with openings through which the wafer W can be carried in/out by the wafer holding arms 61, 62, and 63 at positions facing to the transfer section 3. Further, the three extension and cooling units (EXTCOL) of the seventh processing section $G_7$ are provided with openings both on the transfer section 3 side and the interface section 5 side.

Figure 7:
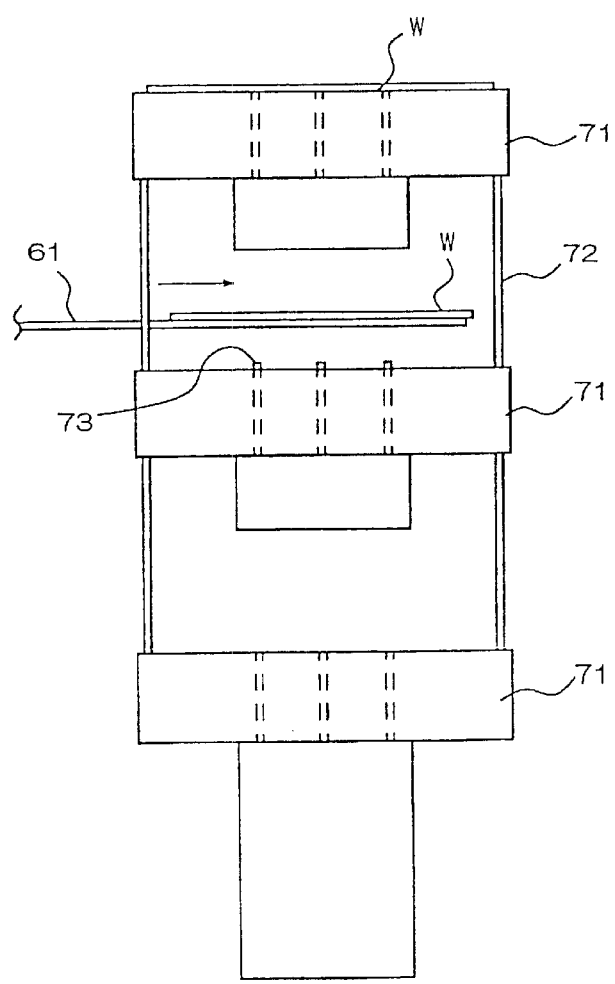
FIG. 7 is a sectional view showing a buffer mechanism in the transfer section in FIG. 1.

As shown in FIG. 7, the buffer mechanism 14 has a plurality of (three in the drawing) stages (mounting sections) 71 provided in tiers. The plurality of stages 71 are supported by support columns 72 and embed lift pins 73 for the wafer w which can freely appear and disappear therein. Each stage 71 of the buffer mechanism 14 is so structured that the arm (the arm 61 in the drawing) of the wafer delivery portion 52 in each of the main wafer transfer mechanisms 11, 12, and 13 is accessible thereto and has a function for allowing the wafer W to stand by thereon temporarily. Additionally, a cooling mechanism is embedded in each of the stages 71, so that the stage 71 also serves as a cooling plate.

The aforesaid interface section 5 is provided, facing the seventh processing section $G_7$ as shown in FIG. 1 and has an interface transfer mechanism 21 for delivering the wafer W to/from the processing section 2. On both sides of the interface transfer mechanism 21, which is regarded as a center, a hot plate and extension block 22 in which a hot plate unit and an extension unit are vertically tiered and a pickup and buffer cassette block 24 in which a pickup cassette and a buffer cassette are vertically tiered, are provided respectively.

Figure 8:
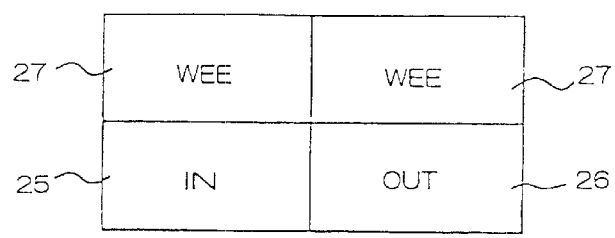
FIG. 8 is a view showing a configuration example of peripheral exposure apparatuses and stages in FIG. 1.

On the side opposite to the seventh processing section $G_7$ in relation to the interface transfer mechanism 21, two peripheral exposure units 27 are provided on the upper stage t hereof and an in-stage 25 and an out-stage 26 for carrying the wafer W into/out of the exposure apparatus 50 are provided on the lower stage as shown in FIG. 8. The in-stage 25 of them has a cooling function, thereby suppressing an influence of thermal expansion of the wafer W which is inserted to the exposure apparatus 50.

The interface transfer mechanism 21 is provided with a wafer delivery portion (not shown) which has wafer holding arms and is vertically movable, and thus accessible to each processing unit of the seventh processing section $G_7$ so as to deliver the wafer W to/from the processing station 2 via the three extension and cooling units (EXTCOL) and also to/from the hot plate and extension block 22 and the peripheral exposure units 27. In the hot plate unit of the hot plate and extension block 22, the substrate after exposure is subjected to postexposure bake processing.

In the resist coating and developing system structured as above, one wafer W is taken out of a wafer cassette CR on the cassette station 4 by any one of the arms of the main wafer transfer mechanism 11 or 12 and placed on any one of stages 71 of the buffer mechanism 14. Then, any one of the arms of the main transfer mechanism 11 or 12 goes to take out another wafer W from a cassette CR.

Meanwhile, the wafer W on the stage 71 is received by any one of the arms of the main wafer transfer mechanism 13 and transferred to the adhesion unit (AD) of the processing section $G_7$ and subjected to hydrophobic processing (HMDS processing) to enhance fixedness of a resist there. Since this processing is attended with heating, the wafer W is then taken out of the adhesion unit (AD) by any one of the arms of the main transfer mechanism 13. Thereafter, the wafer W is transferred to the extension and cooling unit (EXTCOL) of the processing section $G_7$ by the same arm to be cooled, or it is placed on any one of the stages 71 of the buffer mechanism 14 and thereafter transferred to the cooling unit of the processing section $G_5$ or the processing section $G_6$ by any one of the arms of the main wafer transfer mechanism 11 or 12 to be cooled.

Subsequently, after placed any one of the stages 71 of the buffer mechanism 14 as required, the wafer W is transferred to the resist coating unit (CT) by any one of the arms of the main wafer transfer mechanism 13, where a resist film is formed by spin coating in which a resist solution is dropped while the wafer W is rotated.

After the completion of the coating processing, the wafer W is placed on a stage 71 of the buffer mechanism 14 as required and subjected to pre-bake processing in any one of the hot plate units (HP) of the processing section $G_5$, $G_6$, or $G_7$ by the medium of the corresponding main wafer transfer mechanism. Subsequently, the wafer W is placed on a stage 71 of the buffer mechanism 14 also as required, and thereafter transferred to the cooling unit (COL) of any one of the processing sections by the corresponding main wafer transfer mechanism to be cooled there. After placed on a stage 71 of the buffer mechanism 14 as required, the cooled wafer W is transferred to the alignment unit (ALIM) of the processing section $G_7$ by any one of the arms of the main wafer transfer mechanism 13 to be aligned there, and thereafter transferred to any one of the extension and cooling units (EXTCOL) of the processing section $G_7$ again by any one of the arms of the main wafer transfer mechanism 13.

The wafer W which is transferred to the extension and cooling unit (EXTCOL) is received by the arm of the interface transfer mechanism 21 of the interface section 5. The wafer W is first carried into the peripheral exposure apparatus 27 and subjected to peripheral exposure, where the excess resist is removed, then transferred to the in-stage 25 to be cooled, and thereafter carried into the exposure apparatus 50 to be exposed in a predetermined pattern.

After exposure, the wafer W is placed on the out-stage 26 and subjected to postexposure bake processing in any one of the hot plates (HP) of the block 22 by the medium of the arm of the interface transfer mechanism 21. Thereafter, the wafer W is transferred to any one of the extension and cooling units (EXTCOL) of the seventh processing section $G_7$ by the arm of the interface transfer mechanism 21 to be cooled.

Then, the wafer W is placed on any one of the stages 71 of the buffer mechanism 14 by any one of the arms of the main wafer transfer mechanism 13 and transferred to any one of the developing units (DEV) by any one of the arms of the main wafer transfer mechanism 11 or 12, where its exposed pattern is developed. After the completion of the development, the wafer W is placed on any one of the stages 71 of the buffer mechanism 14 as required and transferred to any one of the hot plate units (HP) of the processing sections $G_5$, $G_6$, or $G_7$ by the corresponding main wafer transfer mechanism to be subjected to post-bake processing there. Sequentially, the wafer W is placed on any one of the stages 71 of the buffer mechanism 14 as required and thereafter transferred to the cooling unit (COL) of any one of the processing sections by the corresponding main wafer transfer mechanism to be cooled there. After returned to any one of the stages 71 of the buffer mechanism 14, the semiconductor wafer W is housed in a predetermined cassette CR in the cassette station 4 by any one of the arms of the main wafer transfer mechanism 11 or 12.

As described above, in this embodiment, the plurality of processing units are disposed around the transfer section 3 having the plurality of main wafer transfer mechanisms 11, 12, and 13, thereby disposing many processing units around the transfer section 3, so that the footprint-per-processing ability can be made smaller than in the case of using an apparatus in which a plurality of processing units are disposed around one transfer mechanism. Moreover, since a period of time of restraint of the main transfer mechanisms 11, 12, and 13 can be reduced by disposing the buffer mechanism 14 at a position to which each of the main transfer mechanisms 11, 12, and 13 is accessible, that the arm of the main wafer transfer mechanism stands by while placing the wafer W thereon can be avoided, resulting in high throughput. Further, the period of time of restraint of the main transfer mechanisms 11, 12, and 13 can be reduced as above, thereby preventing the wafer W from being left standing in the processing unit after the expiration of a predetermined period of time, so that a bad influence exerted on the wafer W such as overbake or the like in the pre-bake processing in the hot plate unit (HP) can be avoided.

Specifically since the plurality of processing sections in each of which processing units are multi-tiered are arranged and the substrate delivery portions 52 of the main wafer transfer mechanisms 11, 12, and 13 move vertically to get access to the multi-tiered processing units, each main transfer mechanism has quit lots of tasks. However, in the aforesaid embodiment, the buffer mechanism 14 has multi-tiered stages 71, thereby allowing a plurality of wafers W to stand by on the stages at a time. Even in this case, it can be nearly securely avoided that the main wafer transfer mechanisms 11, 12, and 13 stand by while placing the wafers W thereon. Moreover, the structure in which the main wafer transfer mechanisms 11, 12, and 13 are disposed around the buffer mechanism 14 can reduce the transfer path of the wafer in length, so that high throughput can be actually realized.

Furthermore, since the interface section 5 has the hot plate for performing bake processing for the wafer after exposure therein, a period of time until postexposure bake after exposure can be fixed, so that unevenness of processing can be made quite small. Since the in-stage 25 of the interface section 5 has a cooling function, an influence of thermal expansion of the wafer W when the wafer W is inserted into the exposure apparatus can be avoided. The interface transfer mechanism 21 of the interface section 5 is movable in the vertical direction and accessible to each processing unit of the seventh processing section $G_7$ provided adjacent to the interface section 5, and can deliver the wafer W to/from the processing section 2 via the three extension and cooling units (EXTCOL), so that the wafer W can be smoothly delivered to the interface section 5 without variations in transfer. Moreover, the wafer W after postexposure bake processing can be cooled by means of the three extension and cooling units (EXTCOL) of the seventh processing section $G_7$, resulting in quite high efficiency.

Furthermore, the processing section 2 has a structure in which the processing sections are disposed to form a nearly equilateral triangle in a plane arrangement, and the processing sections $G_5$, $G_6$, and $G_7$ are disposed at positions corresponding to the apexes of the triangle and turned respectively about the hinges 31, 32, and 33 so as to be installable and removable (freely attached and detached). Accordingly, the processing sections are turned in the directions indicated by the arrows to remove from the positions for processing during no processing is performed, whereby maintenance of the transfer section 3 can be easily performed. It should be noted that the interface section 5 is freely attached and detached to/from the processing station 2 and the processing section $G_7$ becomes removable after the interface station 2 is detached. In the arrangement of the nearly equilateral triangle as described above, the frame of the processing section 2 is also a nearly equilateral triangle and thus every side thereof is nearly identical in shape, so that it is suitable for mass production. The processing units are arranged as described above, thereby increasing a clearance between spinner-type units and thermal units, so that the thermal influence exerted on the spinner-type units can be reduced. The access to the inside of the system is easy through the use of the above large clearance, and thus maintenance of the inside of the system is easy.

Furthermore, since the cassette station 4 is provided at a position to which the main wafer transfer mechanisms 11 and 12 are accessible, a transfer mechanism which is provided in a conventional cassette station becomes unnecessary, thereby further enhancing apparatus efficiency. The cassette mounting tables of the cassette station 4 are provided in two tiers, whereby the number of the mounted wafer cassettes CR can be increased (six in this embodiment) resulting in enhancement of processing efficiency. Moreover, the developing units (DEV) are disposed on the cassette station 4, so that the footprint of the apparatus can be correspondingly reduced.

Further, since each stage 71 of the buffer mechanism 14 has a cooling function, the wafer W allowed to stand by thereon can be cooled to a predetermined temperature, thus avoiding a thermal influence exerted on the processing unit to which the wafer W is subsequently transferred.

In the system shown in FIG. 1, two coating units CT (the coating unit CT of the processing section $G_2$ and the coating unit CT of the processing section $G_4$) can be arranged at positions, nearly equidistant from the main transfer mechanism 13, to which the main wafer transfer mechanism 13 is accessible, so that the wafer W can be transferred to each coating unit CT from the extension and cooling unit of the processing section $G_7$ in an even period of time. Thereby, unevenness of thickness of a resist film can be suppressed.

To the system according to the present invention, two or more exposure apparatuses can be connected. An example in which two exposure apparatuses are connected is shown in FIG. 9.

Figure 9:
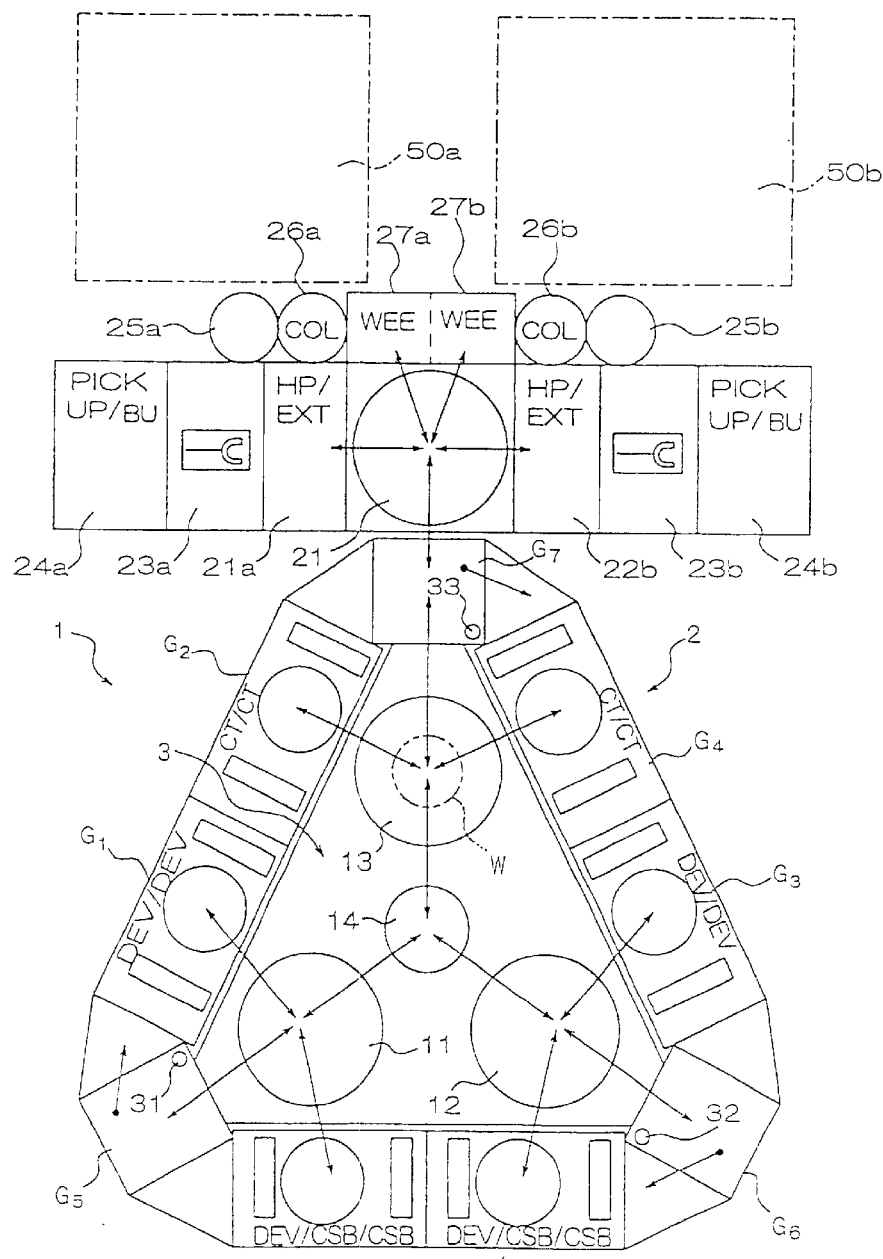
FIG. 9 is a plane view of the whole configuration of a coating and developing system for a semiconductor wafer according to another embodiment of the present invention.

As shown in FIG. 9, an interface section 5 is provided, facing a seventh processing section $G_7$ and has an interface transfer mechanism 21 for delivering a wafer W to/from a processing section 2. On both sides of the interface transfer mechanism 21, which is regarded as a center, hot plate and extension blocks 22a and 22b in each of which a hot plate unit and an extension unit are vertically tiered are provided, transfer devices 23a and 23b are provided on both sides of the hot plate and extension blocks 22a and 22b respectively, and further pickup and buffer cassette blocks 24a and 24b in each of which a pickup cassette and a buffer cassette are vertically tiered are provided respectively. On the side opposite to the seventh processing section $G_7$ in relation to the interface transfer mechanism 21, two peripheral exposure units 27a and 27b are provided. Two stages 25a and 26a each for carrying the wafer W into/out of an exposure apparatus 50a are provided at positions to which the transfer device 23a is accessible. The stage 26a of them has a cooling function, thereby suppressing an influence of thermal expansion of the wafer W which is inserted to the exposure apparatus 50a. Two stages 25b and 26b each for carrying the wafer W into/out of an exposure apparatus 50b are similarly provided at positions to which the transfer device 23b is accessible. The stage 26b of them has a cooling function.

The interface transfer mechanism 21 includes a wafer delivery portion (not shown), which has wafer holding arms and is vertically movable, and accessible to each processing unit of the seventh processing section $G_7$ so as to deliver the wafer W to/from the processing station 2 via three extension and cooling units (EXTCOL) and also to/from the hot plate and extension blocks 22a and 22b and the peripheral exposure units 27a and 27b. In each of the hot plate units of the hot plate and extension blocks 22a and 22b, the substrate after exposure is subjected to postexposure bake processing. Via the extension units, the wafers W are delivered to/from the transfer devices 23a and 23b. The transfer devices 23a and 23b also deliver the wafers W to/from the pickup and buffer cassette blocks 24a and 24b.

Since ten spinner-type units can be mounted and two exposure apparatuses can be disposed as described above, two sets of two coating units, three developing units, and one exposure apparatus can be formed, so that 150 wafers can be processed per hour.

The present invention is not limited to the above concrete embodiments and various changes may be made. For instance, though the resist coating and developing system in which a resist solution is applied and developed has been explained in the above embodiments, not limited to such a resist coating and developing system, a processing apparatus in which a plurality of processes are performed by means of a plurality of processing mechanisms is applicable. Furthermore, the semiconductor wafer has been explained as an example of a substrate, but the system is applicable also to processing of another substrate, for example, an LCD substrate in addition to the semiconductor wafer. Moreover, the example in which the plurality of processing sections including the plurality of processing units arranged in tiers are disposed around the transfer section has been shown, but it is not necessarily to have this structure. The plane arrangement of the process station is not limited to a triangle, but also it may be another shape such as a rectangle or the like. Furthermore, the number of the main transfer devices is not limited to three, but also it may be two or four or more.

As has been described, according to the present invention, the plurality of processing mechanisms are disposed around the transfer section including the plurality of transfer mechanisms, whereby many processing mechanisms can be arranged around the transfer section, so that the footprint-per-processing ability can be made smaller than in the case of using an apparatus in which a plurality of processing mechanisms are disposed around one transfer mechanism. A period of time of restraint of the transfer mechanisms can be reduced by disposing the buffer mechanism at a position to which each of the plurality of transfer mechanisms is accessible, thus preventing the transfer mechanism from standing by while placing the substrate thereon, resulting in high throughput. Moreover, since it is also possible to prevent the substrate from being left standing in the processing mechanism after the expiration of a predetermined period of time, a bad influence exerted on the substrate can be avoided.

The plurality of processing sections in each of which the plurality of processing mechanisms are multi-tiered in the vertical direction are disposed around the transfer section including the plurality of transfer mechanisms each having the substrate delivery portion which is provided to be movable in the vertical direction, whereby a great many processing mechanisms can be arranged around the transfer section, so that the footprint-per-processing ability can be made smaller than in the case of using an apparatus in which processing sections comprising a plurality of multi-tiered processing mechanisms are arranged around one transfer mechanism. The buffer mechanism including the plurality of standby sections in tiers is disposed at a position to which each of the plurality of transfer mechanisms is accessible, whereby a period of time of restraint of the transfer mechanisms can be reduced, thus preventing the transfer mechanism from standing by while placing a substrate thereon, resulting in high throughput.

Moreover, the transfer section has a structure in which the plurality of transfer mechanisms each having the delivery portion which is movable in the vertical direction are provided around the buffer mechanism having the plurality of standby sections in tiers, and the plurality of processing sections in each of which the plurality of processing mechanisms are multi-tiered in the vertical direction are disposed around the transfer section, so that arrangement efficiency of the apparatus is high and thus it is possible to further reduce the footprint. Moreover, the plurality of transfer mechanisms are arranged around the buffer mechanism, thereby reducing the transfer path by the medium of the transfer mechanism in length, so that higher throughput can be attained.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus for performing a process including a plurality of processing steps, said apparatus comprising:

a plurality of units arranged vertically to form a plurality of stacked units, the plurality of stacked units including a first set of stacked units each stacked unit of the first set of stacked units having a processing unit that applies a liquid treatment to a substrate using a processing liquid and a second set of stacked units each having a thermal processing unit that applies a thermal treatment to a substrate, wherein, as viewed in a vertical direction, said plurality of stacked units are arranged to form a triangle having three sides and three vertexes, the first set of stacked units form the sides of the triangle, and the second set of stacked units are located at the vertexes of the triangle;

a plurality of substrate conveyers arranged within an area defined by the sides of the triangle, each substrate conveyer having a substrate handling member that transports a substrate to and from the plurality of units and is capable of vertical movement; and a buffer mechanism that temporarily stores a substrate, the buffer mechanism being arranged in the area defined by the sides of the triangle and located at a position where all of the substrate conveyers are accessible to the buffer mechanism.

2. The apparatus according to claim 1, wherein the substrate conveyers are arranged around the buffer mechanism.

3. The apparatus according to claim 1, wherein the buffer mechanism has a plurality of platforms arranged vertically whereby a substrate can be temporarily stored on one of the plurality of platforms.

4. The apparatus according to claim 1, wherein each processing unit that applies a liquid treatment to a substrate is at least one of a resist coating unit that applies a resist solution to a substrate and a developing unit that develops an exposed resist coated on a substrate by use of a developing liquid.

5. The apparatus according to claim 4 further comprising an interface unit that transfers a substrate coated with a resist to an exposing unit.

6. The apparatus according to claim 5, wherein the interface unit includes a heat treatment unit that applies a baking treatment to the substrate coated with a resist solution.

7. The apparatus according to claim 5, wherein the interface unit includes a cooling unit that cools the substrate.

8. The apparatus according to claim 5, wherein the interface unit is arranged outside the area defined by the sides of the triangle and is located adjacent to one of the stacked units, and wherein the interface unit includes a substrate conveyer having a substrate handling member that transports a substrate and is capable if vertical movement to serve all of the units included in said one of the sets of stacked units adjacent to the interface unit.

9. The apparatus according to claim 8, wherein said one of the stacked units located adjacent to the interface unit includes a plurality of cooling units.

10. The apparatus according to claim 1, wherein the second set of stacked units are arranged so that they can be removed from their positions.

11. The apparatus according to claim 1, further comprising a container storage unit capable of storing a container, which contains processed substrates or unprocessed substrates.

12. The apparatus according to claim 11, wherein at least one of the substrate conveyers is capable of accessing the substrates contained in the container stored in the container storage unit.

13. The apparatus according to claim 11, wherein the container storage unit forms at least one of the stacked units together with at least one of said plurality of units.

14. The apparatus according to claim 11, wherein the container storage unit has a plurality of platforms, on each of which the container is placed, the platforms arranged in a vertical direction.

15. The apparatus according to claim 1, wherein a platform of the buffer unit is provided with a cooler that cools the substrate placed on the platform.

16. The apparatus according to claim 11, wherein said plurality of units includes third and fourth stacked units each including a resist coating unit, fourth are arranged on two of the sides of the triangle, respectively, so that said third and fourth stacked units are at the same distance away from the vertex of the triangle located at an intersection between said two of the sides, said apparatus further comprising:

an interface unit that transfers a substrate between an exposing unit and the stacked units arranged at the vertex of the triangle located at the intersection between said two of the sides, the interface unit being arranged outside the area defined by the triangle and adjacent to the stacked units arranged at the vertex of the triangle located at the intersection between said two of the sides.

17. The apparatus according to claim 1, wherein, as viewed in a vertical direction, said plurality of stacked units are arranged to form a polygon having at least three sides and at least three vertexes, the first set of stacked units form the sides of the polygon, and the second set of stacked units are located at the vertexes of the polygon.

18. A substrate processing apparatus for performing a process including a plurality of processing steps, said apparatus comprising:

a plurality of units arranged vertically to form a plurality of stacked units, the stacked units including a first set of stacked units each having at least one of a resist coating unit that applies a resist solution to a substrate and a developing unit that develops an exposed resist using a developing liquid and a second set of stacked units each having a thermal processing unit that applies a thermal treatment to a substrate, wherein, as viewed in a vertical direction, said plurality of stacked units are arranged so that they form a triangle having three sides and three vertexes, the first set of stacked units form the sides of the triangle, and the second set of stacked units are removably arranged at the vertexes of the triangle;

a plurality of substrate conveyers, arranged within an area defined by the sides of the triangle, each of which has a substrate handling member that transports a substrate to and from the units and is capable of vertical movement; and a buffer mechanism that temporarily stores a substrate, the buffer mechanism being arranged within the area defined by the sides of the triangle and located at a position where all of the conveyers are accessible to the buffer mechanism.

19. The apparatus according to claim 18, wherein:

said apparatus is provided with three conveyers as said plurality of conveyer, each of said three conveyers are arranged adjacent to the second set of stacked units located at each of the vertexes of the triangle;

each of the conveyers is assigned to one of the second stacked units, and is also assigned to first sets of stacked units adjacent to each of the second sets of stacked units; and the buffer mechanism is arranged in proximity of a center of gravity of the triangle.

* * * * *